US007877662B2

(12) United States Patent
Eleftheriou et al.

(10) Patent No.: US 7,877,662 B2
(45) Date of Patent: *Jan. 25, 2011

(54) REVERSE CONCATENATION FOR PRODUCT CODES

(75) Inventors: Evangelos S. Eleftheriou, Zurich (CH); Robert A. Hutchins, Tucson, AZ (US); Thomas Mittelholzer, Zurich (CH); Paul J. Seger, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 977 days.

This patent is subject to a terminal disclaimer.

(21) Appl. No.: 11/690,619

(22) Filed: Mar. 23, 2007

(65) Prior Publication Data

US 2008/0235556 A1   Sep. 25, 2008

(51) Int. Cl.
*H03M 13/00* (2006.01)
(52) U.S. Cl. .................. 714/756; 714/779; 714/781
(58) Field of Classification Search .............. 714/756, 714/779, 781
See application file for complete search history.

(56) References Cited

U.S. PATENT DOCUMENTS

| 5,521,943 | A | * | 5/1996 | Dambacher ................ 375/295 |
| 5,559,644 | A |  | 9/1996 | Ozaki et al. |
| 6,172,829 | B1 |  | 1/2001 | Ozaki et al. |
| 6,476,734 | B2 | * | 11/2002 | Jeong et al. ................... 341/50 |
| 6,505,320 | B1 |  | 1/2003 | Turk et al. |
| 6,598,203 | B1 | * | 7/2003 | Tang ........................... 714/790 |
| 6,816,556 | B2 | * | 11/2004 | Kim ............................ 375/265 |
| 7,030,789 | B1 | * | 4/2006 | Cideciyan et al. ............. 341/83 |
| 7,035,316 | B2 | * | 4/2006 | Smee et al. .................. 375/147 |
| 7,064,687 | B1 | * | 6/2006 | Blaum et al. ................. 341/80 |
| 7,126,502 | B2 | * | 10/2006 | Blaum et al. ................. 341/58 |

OTHER PUBLICATIONS

ECMA: "ECMA-319: Data Interchange on 12, 7 mm 384—Track Magnetic Tape Cartridges—Ultrium-1 Format"; Internet citation, [online] XP002395655; URL: http://www.ecma-international.org/publications/files/ECMA-ST/Ecma-319.pdf; pp. 71-78.

(Continued)

*Primary Examiner*—Esaw T Abraham
(74) *Attorney, Agent, or Firm*—Dan Shifrin

(57) ABSTRACT

A system is provided to encode data for recording onto media whereby modulation and linear constraints from a concatenated code or product code are imposed. A first array of unencoded user data is generated. Each row is modulation encoded to enforce a first modulation constraint; the array is transformed into a second array which is transformed into a third array having predetermined empty locations in each column interleaved with the modulated data. A C2-parity byte is computed for at least some of the empty locations of the third array and a fourth array is generated. C1-parity symbols in each row are computed, generating a fifth array. A second modulation constraint is enforced on each C1-parity symbol in each row of the fifth array, generating a sixth array. The rows of the sixth array are assembled with header and sync fields for recording onto a recording media.

20 Claims, 9 Drawing Sheets

OTHER PUBLICATIONS

Jaquette, G. A., "LTO: A Better Format for Midrange Tape"; IBM Journal of Research and Development; International Business Machines, Corporation, New York, NY; vol. 47, No. 4, Jul. 1, 2003; pp. 429-444, XP002395659; ISSN: 0018-8646.

Luca, R. et al: "On Reverse Concatenation and Soft Decoding Algorithms for PRML Magnetic Recording Channels"; IEEE Journal on Selected Areas in Communications, IEEE Service Center, Piscataway, NY; vol. 19, No. 4, Apr. 1, 2001; XP01155357; ISSN: 0733-8716.

Poo, T.L. et al.: "On Reverse Concatenation and the Rate of Average Intersection"; Proceedings 2003 IEEE International Symposium on Information Theory, ISIT 03, Yokohama, Japan, Jun. 29-Jul. 4, 2003; New York, NY; Jun. 29, 2003; p. 75; XP010657103; ISBN: 978-0-7803.

Adriann J Van Wijngaarden, et al; "Maximum Runlength-Limited Codes with Error Control Capabilities"; IEEE Journal on Selected Areas in Communications; IEEE Service Center, Piscataway, NY; vo. 19, No. 4, Apr. 1, 2001; XP011055362; ISSN: 0733-8716.

Alekhnovich, M: "Linear Diophantine Equations Over Polynomials and Soft Decoding of Reed-Solomon Codes"; IEEE Transactions on Information Theory; US; vol. 51, No. 7, Jul. 1, 2005; pp. 2257-2265; ISSN: 0018-9448.

Alekhnovich, M. (ED): "Linear Diophantine Equations Over Polynomials and Soft Decoding of Reed-Solomon Codes"; 43rd Annual Symposium on Foundations of Computer Science (FOCS 2002), Vancouver, BC, Canada, Nov. 16-19, 2002, Los Alamitos, CA; IEEE Computer Society, US; Nov. 16, 2002; pp. 439-448; XP010628298; ISBN: 978-0-7695-1822-0.

Blaum, M. et al: "High-Rate Modulation Codes for Reverse Concatenation"; IEEE Transactions on Magnetics, IEEE Service Center, New York, NY, vol. 43, No. 2, Feb. 1, 2007, pp. 740-743; XP011157115; ISSN: 0018-9464.

* cited by examiner

REVERSE CONCATENATION FOR PRODUCT CODES

RELATED APPLICATION DATA

The present application is related to commonly-assigned and co-pending U.S. application Ser. No. 11/690,635, entitled REVERSE CONCATENATION FOR PRODUCT CODES, filed on the filing date hereof, which application is incorporated herein by reference in its entirety.

TECHNICAL FIELD

The present invention relates generally to encoding data to be written to recordable media, and in particular, to providing reverse concatenation coding to product codes.

BACKGROUND ART

Data storage systems which use removable media and typically record mass data, such as tape drives and optical disks, rely on strong error-correcting codes (ECC). Tape drives and CD devices employ powerful and complexity-efficient ECC, which is based on code concatenation of an outer C2-code and an inner C1-code. The product code specified in the Linear Tape-Open, Generation 3 (LTO-3) standard is a particular instance of a concatenated coding scheme where both the inner and outer codes are RS-based codes of length 480 and 64, respectively as presented in TABLE I.

TABLE I

| | | | | | | | | | |
|---|---|---|---|---|---|---|---|---|---|
| | | | | LTO-3 product code | | | | | |
| | 0 | 1 | 2 | ... | 465 | 466 | 467 | 468 ... | 479 |
| 0 | 0 | 1 | 2 | ... | 456 | 466 | 467 | | |
| 1 | 468 | 469 | 470 | ... | 933 | 934 | 935 | C1 Parity Bytes | |
| . | | | | | | | | | |
| . | | | | | | | | | |
| . | | | | | | | | | |
| 52 | | | | | | | | | |
| 53 | 24804 | 24805 | 24806 | ... | 25269 | 25270 | 25271 | | |
| 54 | | | | C2 Parity Bytes | | | | | |
| . | | | | | | | | | |
| . | | | | | | | | | |
| . | | | | | | | | | |
| 63 | | | | | | | | | |

A subdata set is a 64×480 array of bytes, i.e., it contains 30,720 bytes, with 54×468=25,272 data bytes, resulting in a code rate of 0.8227. Each 480-byte row comprises a codeword pair. More specifically, the outer C2-code is an $[N_2=64, K_2=54, d_2=11]$ RS code over the Galois field GF(256), where $N_2$ denotes the length, $K_2$ the dimension, and $d_2$ the minimum Hamming distance of the code. The inner C1-code is obtained by even/odd interleaving of an [240, 234, 7] Reed-Solomon (RS) code over GF(256).

In magnetic and optical recording, modulation codes are used to enable timing recovery from the read-back signal and to allow for short path memories in the detector without substantial performance loss. Thus, in the write path prior to writing ECC encoded data onto the media, the ECC encoded data is passed through a modulation encoder. Referring to FIG. 1, a method by which the user data is first encoded by ECC 102 and then passed through a modulation encoder 104, such as a 16/17 run length limited (RLL) encoder, is known as a forward concatenation (FC) architecture 100. To improve ECC performance, there is a long block interleaver 106 in the LTO-3 write path, denoted as the Interleaving & Track Assignment block. This block 106 buffers 64 consecutive product subdata sets thereby accumulating a total of 64×64=4096 rows. These 4096 rows are assigned to the 16 tracks 108 of the tape media in a predefined order. For each track there is a rate-16/17 modulation encoder, which encodes the assigned rows and guarantees the predetermined modulation constraints, namely, a global G=13 and an interleaved I=11 constraint.

Recently, reverse concatenation (RC) architectures have received increased attention in the hard disk drive (HDD) industry. FIG. 2 is a block diagram of such an architecture 200. In an RC architecture 200, the order of the ECC-encoder and modulation encoder is reversed such that the data is first passed through a modulation encoder 202 and the modulated data is ECC-encoded using a systematic encoder 204 for the error correcting code. The ECC parity symbols are either encoded using a second modulation encoder 206, as illustrated, or they are inserted into the data symbol stream at the bit level or symbol level. Inserting entire parity symbols into the data symbol stream is referred to as partial symbol interleaving. Parity insertion strategies result in simple schemes with no error propagation; however, such strategies may weaken the original modulation constraints. Nonetheless, there are three major benefits which make RC attractive:

a) There is no error propagation through the modulation decoder.
b) Because error propagation is not an issue, the first modulation code can be taken to be very long, allowing the use of capacity-efficient and high-rate modulation codes, and thereby resulting in code rate gains.
c) In the read-back path, the ECC decoding block is located immediately after the channel detection block, which enables soft information to be passed from the detector to the decoder on a bit-by-bit basis. This creates the appropriate framework for using novel ECC techniques, which are based on turbo and LDPC codes and which hold the promise of large performance improvements. Furthermore, in this framework, parity post-processing schemes can easily be implemented.

It would be desirable for the same benefits to also be provided in the framework of tape recording. However, the ECC used in HDDs has a different structure than the ECC used in tape recording. In HDDs, ECC is essentially based on a single high-rate Reed-Solomon (RS) code whereas in tape, large powerful product codes are used which require a new RC architecture. RC has been proposed for 1-dimensional ECC architectures, where the ECC typically consists of a single code such as a Reed-Solomon code or an LDPC code. However, the known RC schemes have not addressed the particular issues which arise from ECC which is based on concatenated or product codes. With a concatenated or product code, the output of the inner C1 code is mapped to the tracks/channels and, thus, all rows should satisfy a predetermined modulation constraint. Therefore, a significant drawback is presented, which is illustrated with respect to the LTO-3 product code. Referring again to TABLE I, putting the modulation encoder prior to a systematic ECC encoder will result in only $K_2$ rows which meet the modulation constraint except for the C1-parity part. The remaining $N_2-K_2$ rows (rows 54-63), which consist of C2-parity bytes, do not meet the modulation constraint. The C1-parity part poses a minor problem because it can be treated separately, as in the case of 1-dimensional ECC. However, for the C2-parity part no efficient solution has yet been proposed. Thus, a substantial number of rows would not satisfy a modulation constraint and would need further processing. Following a 1-dimensional RC strategy, these rows would need to be passed through a second modulation encoder or be dealt with using a parity insertion strategy. Both techniques would result in undesired features: a) a second modulation code would lead to error propagation and does not allow soft-information to be passed from the channel detector to the ECC decoder on a bit-by-bit basis; and b) partial symbol interleaving would result in poor performance in case of a dead track because entire faulty rows would be subdivided and spread into other rows causing many errors in many rows.

The aforementioned mentioned drawbacks might be avoided if the outer C2-encoder would commute with the first modulation encoder: that is, if the order of encoding would not matter. But this is not the case and to date a reverse concatenation architecture has not been proposed for product codes.

SUMMARY OF THE INVENTION

The present invention provides a reverse concatenation encoding system for a recording write path. The system comprises means for generating a first data array of unencoded user data, a first modulation encoder to enforce a first modulation constraint on a respective row of the first data array and generate a second data array comprising modulation-constrained data. The system further includes a formatter operable to process the second data array by inserting predetermined empty locations in each column interleaved with the modulation-constrained data and generate a third data array. A C2-encoder is operable to compute a C2-parity byte for each of a plurality of the empty locations in each column of the third data array and generate a fourth data array. A C1-encoder is operable to compute a C1-parity symbol for each row of the fourth data array and generate a fifth array. The system further includes a second modulation encoder operable to impose a second modulation constraint on each C1-parity symbol of the fifth data array and generate a sixth data array. The system further includes means for recording the rows of the sixth data array onto the tracks of a recording medium.

DETAILED DESCRIPTION OF THE PREFERRED EMBODIMENT

Architecture Overview

Figure 1:
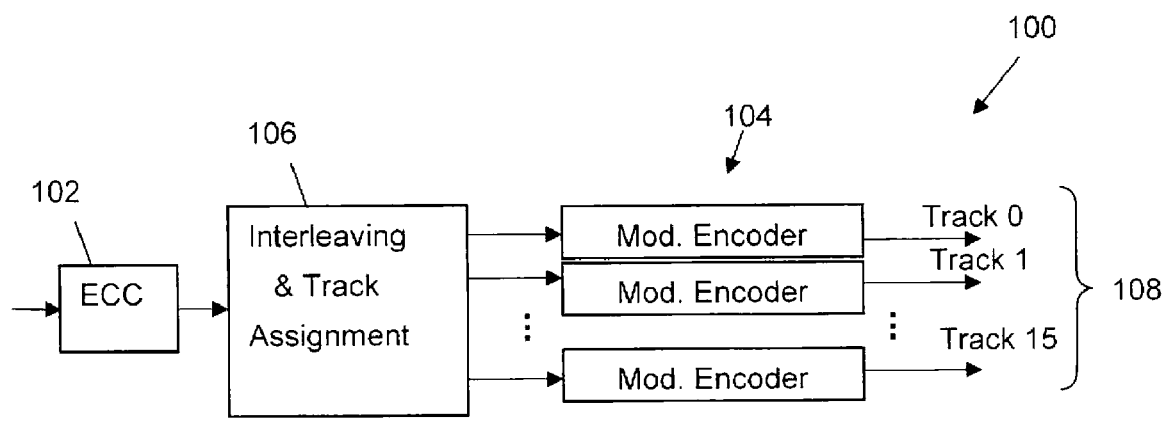
FIG. 1 is a block diagram of prior art data encoding with forward concatenation.
Figure 2:
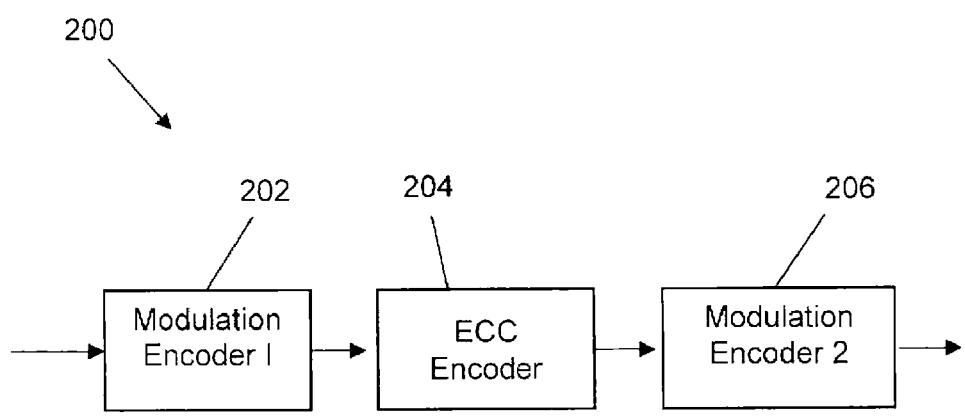
FIG. 2 is a block diagram of prior art data encoding with reverse concatenation.
Figure 3:
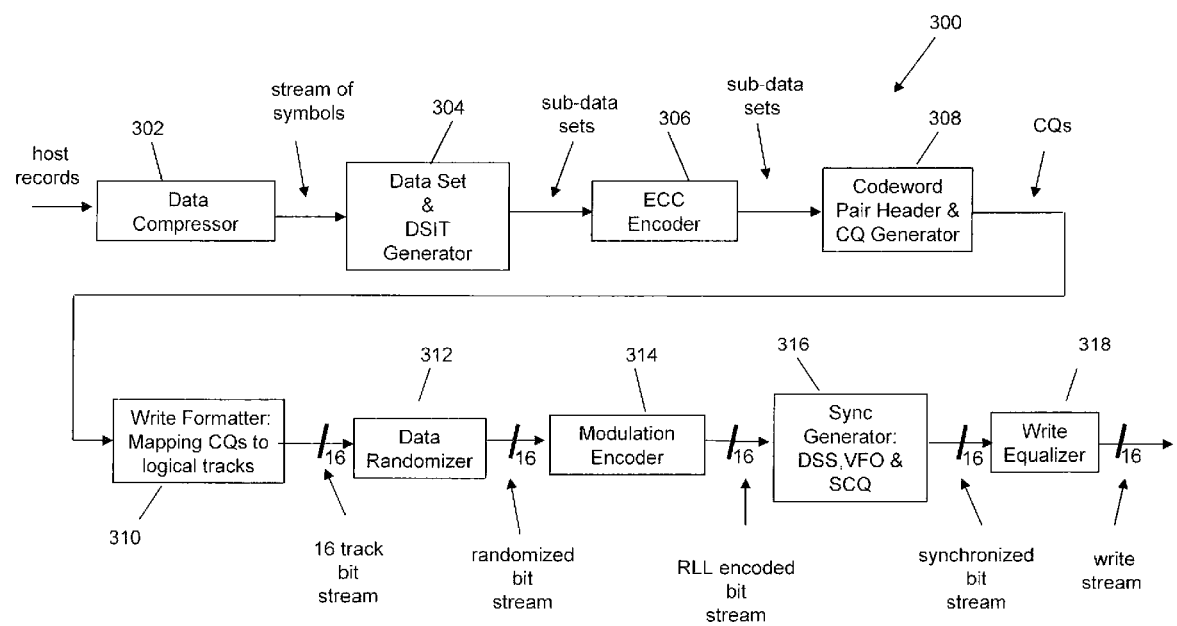
FIG. 3 is a block diagram of a prior art LTO-3 write path.

FIG. 3 is a block diagram of a write path 300 according to the LTO-3 standard. Host records are compressed 302 and a data set and DSIT generator 304 generates subdata sets from the stream of symbols. An ECC encoder 306 provides ECC encoding and passes the encoded subdata sets to a codeword pair header and codeword quad generator 308. The resulting codeword quads are passed to a write formatter 310 in which a 16-track bit stream is generated. The bit stream is processed in a data randomizer 312 and then modulation encoded 314. The RLL encoded bit stream is transformed into a synchronized bit stream by inserting sync and formatting patterns in a sync generation block 316 and the synchronized bit stream is passed through a write equalizer 318, providing a bit stream which may then be recorded onto the media.

Figure 4:
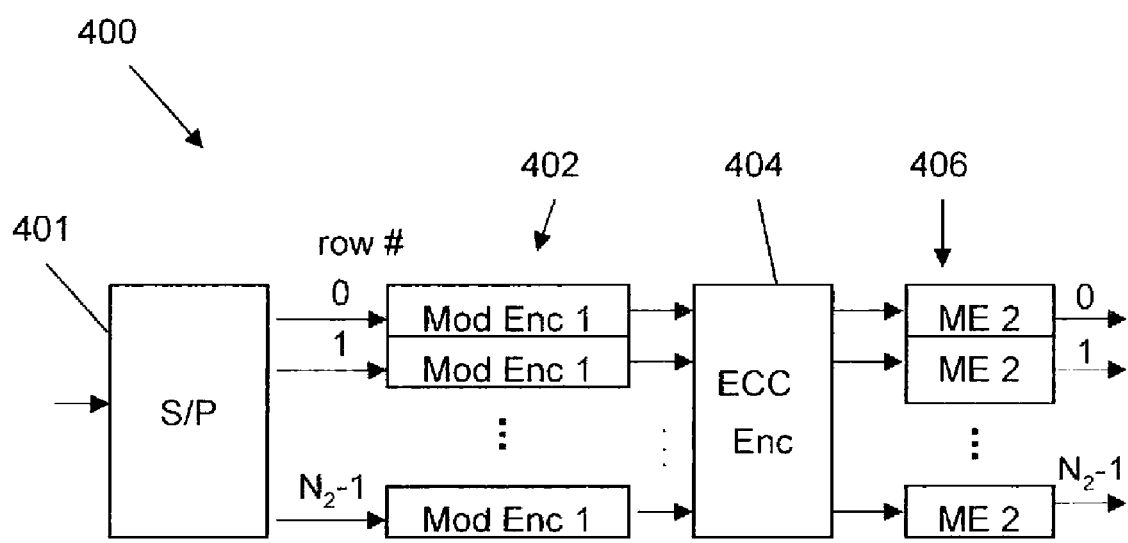
FIG. 4 is a high level block diagram of the reverse concatenation architecture of the present invention.

As illustrated in the high-level overview of FIG. 4, the present invention 400 provides a reverse concatenation architecture in which the data is first passed through a serial/parallel block 401 to form an unencoded array. Each row of the array is modulation encoded in a first modulation encoder 402 and then an ECC is applied in an ECC encoder 404. Each row is either processed through a second modulation encoder 406 or subjected to partial symbol interleaving (not shown) to meet the required modulation constraints.

Figure 5A:
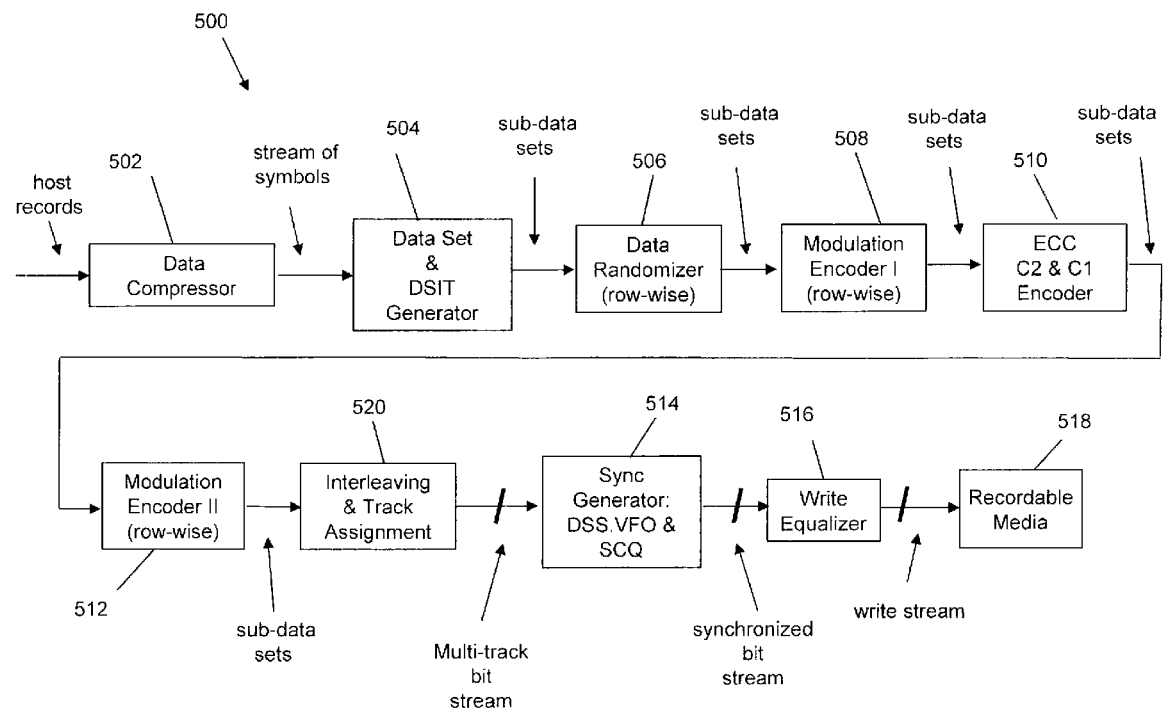
FIG. 5A is a block diagram of a write path in which the reverse concatenation architecture of the present invention may be incorporated.

FIG. 5A is a block diagram of a write path 500 in which the reverse concatenation architecture of the present invention may be incorporated. As with the LTO-3 write path of FIG. 3, host records in the write path 500 of the present invention are compressed 502 and a data set and DSIT generator 504 generates subdata sets from the stream of symbols. The subdata sets are then randomized in a row-wise fashion in a data randomizer 506 and the randomized data passed to a first row-wise modulation encoder 508. C2 and C1 ECC encoders 510 encode the modulation encoded subdata sets, as will be described in more detail. A second modulation encoder 512 provides further modulation encoding to the encoded subdata sets after which the modulated data is processed by an interleaving and track assignment block 520. The resulting multi-track stream of C1-codewords and codeword headers is transformed into a synchronized bit stream by inserting sync and formatting patterns in a sync generation block 514 and the synchronized bit stream is passed through a write equalizer 516, providing a write stream which may then be recorded onto the media 518.

Figure 5B:
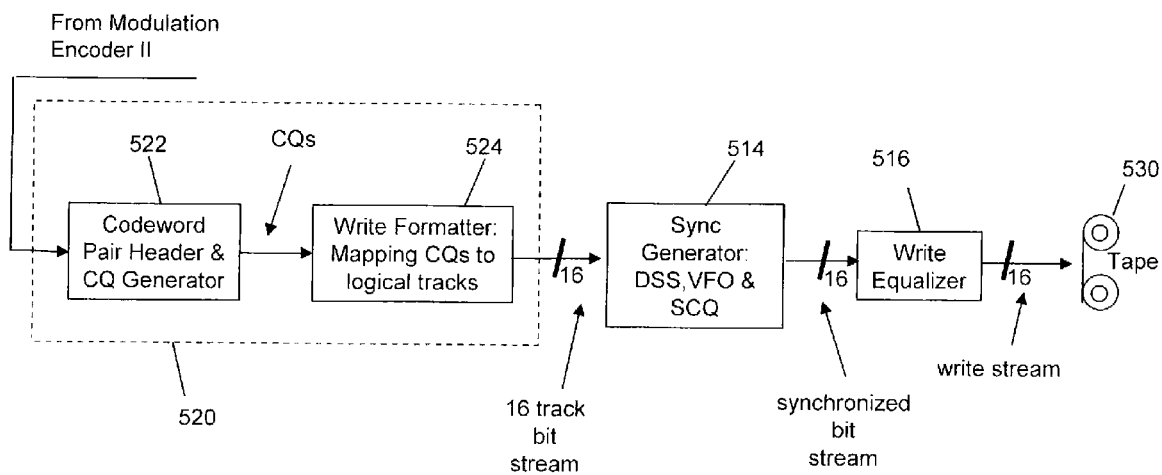
FIG. 5B is a block diagram of a portion of a write path of one embodiment of the present invention.

FIG. 5B is a block diagram of a portion of a write path of an embodiment of the present invention in which the interleaving and track assignment block 520 processes subdata sets into rows in the format for LTO-3 tape media. In this embodiment, the interleaving and track assignment block 520 includes a codeword pair header and codeword quad generator 522 in which the modulated data from the second modulation encoder 512 are interleaved with codeword headers to form codeword quads. The interleaving and track assignment block 520 further includes a write formatter 524 which maps the codeword quads into logical tracks. The resulting 16-track bit stream is transformed into a synchronized bit stream by inserting sync and formatting patterns in the sync generation block 514 and the synchronized bit stream is passed through a write equalizer 516, providing a bit stream which may then be recorded onto the tape 530. It will be appreciated that the present invention is not limited to assembling the C1-codewords and codeword headers in this way but that they may be assembled in other ways.

Figure 6:
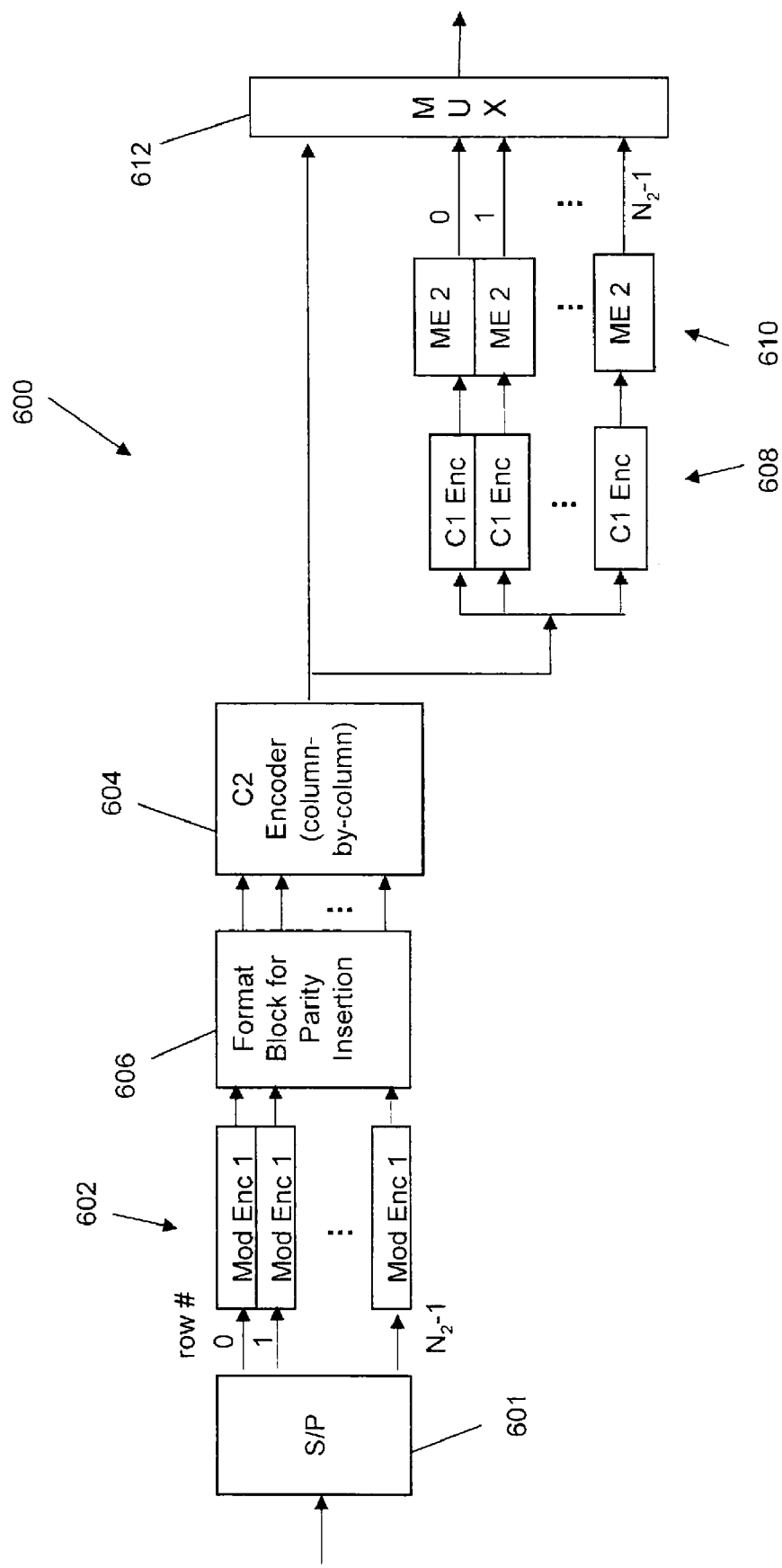
FIG. 6 is a more detailed block diagram of the reverse concatenation architecture of the present invention.

FIG. 6 is a more detailed block diagram of the RC architecture 600 of the present invention. The architecture 600 includes a set of high-rate modulation encoders 602, one for each of the $N_2$ rows (also referred to herein collectively as "the modulation encoder 602") which receive data from a serial/parallel block 601, and an outer, column-by-column C2-encoder 604. The architecture 600 further provides a formatting block 606 interposed between the modulation encoders 602 and the C2 encoder 604. As will be described in more detail, the format block 606 reorganizes the modulation encoded user data array such that its size is based on the length rather than the dimension of the outer code. Following the C2 encoder 604 is an inner C1 encoder 608 for each row to generate parity bytes at the end of each row. Processing of the encoded rows is completed by a set of systematic modulation encoders 610. The data from the C2 encoder 604 and the data from second set of modulation encoders 610 are then multiplexed with in a multiplexer 612 to form the completed subdata set.

User Data Reorganization

In contrast to the conventional encoding of the C2-code of length $N_2$ in which the user data is organized in $K_2$ rows, where $K_2$ is the dimension of C2, the unencoded user data array of the present invention consists of $N_2$ rows which are generated by the serial/parallel block 601. An example of such an unencoded user data array is illustrated in TABLE II, which is a modification of the subdata set array of the LTO-3 standard (TABLE I).

TABLE II

Unencoded user data array with $N_2$ = 64 rows

|    | 0   | 1   | 2   | ... | 402 |
|----|-----|-----|-----|-----|-----|
| 0  | 0   | 1   | 2   | ... | 402 |
| 1  | 403 | 404 | 405 | ... | 805 |
| .  |     |     |     |     |     |
| .  |     |     |     |     |     |

TABLE II-continued

Unencoded user data array with $N_2$ = 64 rows

|    | 0   | 1   | 2   | ... | 402 |
|----|-----|-----|-----|-----|-----|
| 52 |     |     |     |     |     |
| 53 | 21359 | 21360 | 21361 | ... | 21761 |
| 54 |     |     |     |     |     |
| .  |     |     |     |     |     |
| .  |     |     |     |     |     |
| 63 | 25389 | 25390 | 25391 | ... | 25791 |

In particular, the array contains 520 user bytes more than the conventional LTO-3 subdata set. Each row of the unencoded user data array is passed through the first modulation encoder 602 which imposes a modulation constraint at the input of the formatting block 606. At this point, the modulated user data array still contains $N_2$ rows modulation-constrained data which are a few bytes longer due to the first modulation encoder 602. In one embodiment, the first modulation encoder 602 may be derived from a rate-215/216 interleaved Fibonacci modulation code which satisfies the modulation constraints of a global G=14 and an interleaved I=7 constraint. Each row contains 8×403=3224 data bits, which are grouped into 15 bit-sequences of length:

214, 215, 215, 215, 215, 215, 215, 215, 215, 215, 215, 215, 215, 215, 215.

A dummy zero-bit is added at the beginning of the length-214 bit-sequence and, then, all sequences are encoded resulting in 15 bit-sequences all of length 216, which add up to a total of 405 bytes per row. The first modulation code transforms the unencoded user data array of TABLE II into the modulation-constrained user data array of TABLE III.

TABLE III

Modulated user data array with $N_2$ = 64 rows

|    | 0   | 1   | 2   | ... | 404 |
|----|-----|-----|-----|-----|-----|
| 0  | 0   | 1   | 2   | ... | 404 |
| 1  | 405 | 406 | 407 | ... | 805 |
| .  |     |     |     |     |     |
| .  |     |     |     |     |     |
| 52 |     |     |     |     |     |
| 53 | 21465 | 21466 | 21467 | ... | 21869 |
| 54 |     |     |     |     |     |
| .  |     |     |     |     |     |
| .  |     |     |     |     |     |
| 63 | 25515 | 25516 | 25517 | ... | 25919 |

More generally, one selects for the first modulation code a code, which supports partial interleaving of unconstrained symbols such that predetermined global-G and interleaved-I constraints are satisfied after partial symbol interleaving.

Formatting Block

The formatting block 606 transforms the modulated user data array of TABLE III into an array which has $N_2$–$K_2$ empty components in each column. The $N_2$–$K_2$ empty locations are the place-holding positions where the parity symbols to be generated by the C2 encoder 604 will be introduced. In the design phase of the formatting block, a parity pattern array is determined. Given the parity pattern array, the formatting block 606 interleaves the empty cells into the modulated user data array of TABLE III in a row-by-row manner, thereby extending the length of each row by L bytes. This interleaving operation is similar to partial symbol interleaving and weakens the modulation constraint of the first modulation code. In the described example, the insertion of 8-bit parity symbols into the array will weaken the global and interleaved constraints to G=22 and I=11.

Figure 7:
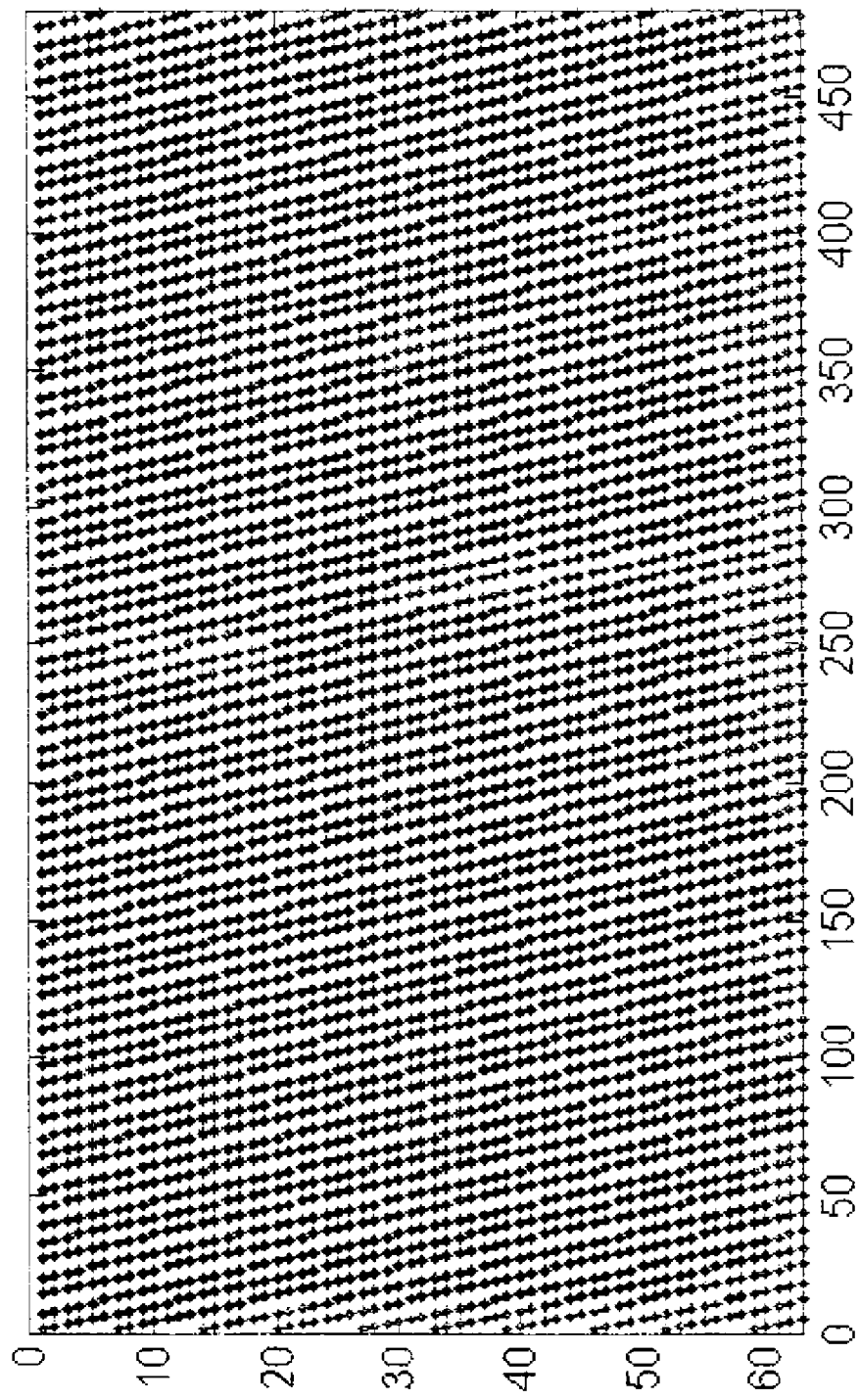
FIG. 7 illustrates a dataset array in which empty locations have been provided by the formatter of the present invention.

To find a parity pattern array, the dimensions of the modulated user data array should satisfy a Diophantine equation, namely, $(M+L) \times (N_2-K_2) = N_2 \times L$, where L is the number of C2-parity symbols per row and $M+L=K_1$ is the dimension of the C1 code on a C2-symbols basis (that is, the dimension of the C1-code must be expressed in C2-symbol units, e.g., in bytes). This Diophantine equation may make it necessary to adjust the parameters of the C1-code. In the LTO-3 based example above, $M+L=K_1=480$ satisfies the equation with L=75 C2-parity byte positions in each row. Furthermore, the parity bytes should be separated by a predetermined minimum amount in order to not fully destroy the modulation constraint of the first modulation code. In the example, a spacing of at least 2 byte locations is enough to obtain the (G, I)=(22, 11) constraint. As there are 64 rows in each parity pattern array, there is a total of 64×75=4800 C2-parity byte locations per parity pattern array. The insertion locations are specified by the following 10 linear equations (modulo 64), which relate the column indices x to the row indices y:

$$y = x + c_i \pmod{64},$$

where $c_i \in \{0, 6, 13, 19, 26, 32, 38, 45, 51, 58\}$ and $0 \leq x < 480 = K_1$. The parity pattern is preferably selected such that each column contains $N_2-K_2=10$ parity locations and such that the pattern repeats within as few columns as possible. In the example, the parity pattern repeats every $32^{nd}$ column. This particular parity pattern array is illustrated in FIG. 7 in which the plotted dots represent the 10 empty parity insertion locations for each column.

Column-Dependent C2-Encoding

Because each column now contains 10 parity place-holding locations, each column may be encoded into a codeword of the rate-54/64 RS C2-code. Moreover, because the parity locations vary from column to column the C2-encoder is also preferably be varying from column to column.

The C2 code may be a Reed-Solomon code although other codes may also be used. Preferably, the code is a maximum-distance separable code which has the useful property that every set of $K_2$ components forms an information set. Thus, every set of $K_2$ components uniquely determines the remaining $N_2-K_2$ parity symbols. At the input of the C2-encoder 604, every column contains $K_2$ modulated data bytes and $N_2-K_2$ empty parity locations. In each column, the C2-encoder 604 determines the $N_2-K_2$ parity bytes from the $K_2$ modulated data bytes and inserts them at the empty parity locations. The output of the C2-encoder 604 is a C2-encoded array of size $N_2 \times K_1$, as illustrated in TABLE IV. The C2-encoded array satisfies a predetermined modulation constraint along each row.

TABLE IV

C2-Encoded Subdata Set
('x' Denotes C2 Parity Locations)

| | 0 | 1 | 2 | 3 | 4 | 5 | 6 | 7 | 8 | ... | 479 |
|---|---|---|---|---|---|---|---|---|---|---|---|
| 0 | x | | | | | x | | | | | |
| 1 | | x | | | | | x | | | | |
| 2 | | | x | | | | | x | | | |
| . | | | | | | | | | | | |
| . | | | | | | | | | | | |
| . | | | | | | | | | | | |
| 63 | | | | | x | | | | | ... | x |

More generally, the C2-encoder is an encoder for a rate $K_2/N_2$ Reed-Solomon code over the Galois field $GF(2^m)$ and, in particular, the codeword components consist of m-bit symbols.

C1-Encoding

The rows of the C2-encoded array are then passed through the C1-encoders 608 for the C1-code. The resulting C1-parity symbols may either be processed by the second modulation encoder 610, as illustrated in FIG. 6, or be partially interleaved bit-wise or byte-wise into the data stream of the C1-encoder 608. In the above LTO-3-based example, the C1-code of dimension $K_1=480$ and length $N_1=492$ is obtained as an even/odd interleaved Reed-Solomon code of dimension 240 and length 246 over GF(256). Such a code generates 2×6=12 interleaved RS-parity bytes per row and which are appended to the end of each row, as illustrated in TABLE V. The even and odd parity bytes in a row are represented by asterisks and dots, respectively.

TABLE V

C1/C2-Encoded Subdata Set

| | 0 | 1 | 2 | 3 | 4 | 5 | 6 | 7 | 8 | ... | 479 | 480 | 481 | ... | 490 | 491 |
|---|---|---|---|---|---|---|---|---|---|---|---|---|---|---|---|---|
| 0 | x | | | | | | x | | | | | * | ● | | * | ● |
| 1 | | x | | | | | | x | | | | * | ● | | * | ● |
| 2 | | | x | | | | | | x | | | * | ● | | * | ● |
| . | | | | | | | | | | | | | | | | |
| . | | | | | | | | | | | | | | | | |
| . | | | | | | | | | | | | | | | | |
| 63 | | | | x | | | | | ... | x | | * | ● | | * | ● |

More generally, the C1-encoder may be obtained from an even/odd interleaved Reed-Solomon code of dimension $K_1$ and length $N_1$ over $GF(2^8)$. The C1-encoder may be derived from a linear code over a Galois field $GF(2^r)$, i.e., with r-bit symbols, and which has dimension $mK_1$ over GF(2). The C1-encoder may also be derived from a low-density parity-check code over a Galois field $GF(2^r)$ and which has dimension $mK_1$ over GF(2).

Final Modulation Coding

Figure 8:
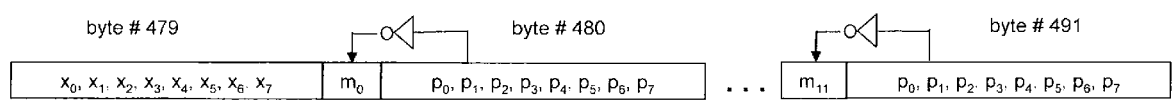
FIG. 8 is a functional diagram of a systematic second modulation encoder of the present invention.

FIG. 8 illustrates the manner of how to impose the (G, I)=(22, 11) constraint throughout the appended C1-parity bytes, the 12 C1-parity bytes in each row are preferably passed through a systematic second modulation encoder 610 which adds a single modulation bit to the beginning of each of the C1-parity bytes in each row. The modulation bit is preferably determined by inverting the second bit $p_1$ in each C1-parity byte, which characterizes a secondary systematic encoder, and prepending it to the parity byte. The simple second modulation encoder 610 may be an inverter with a simple inverse and allows soft information to be passed from the channel bit detector to the ECC decoder on a bit-by-bit basis when the data is read. Moreover, the second modulation encoder 610 preserves the G=22 and I=11 constraint. Other, non-systematic modulation schemes may be used, such as by applying the 16/17-code of LTO-3. However, passing soft information might then not be performed on a bit-by-bit basis.

Figure 9:
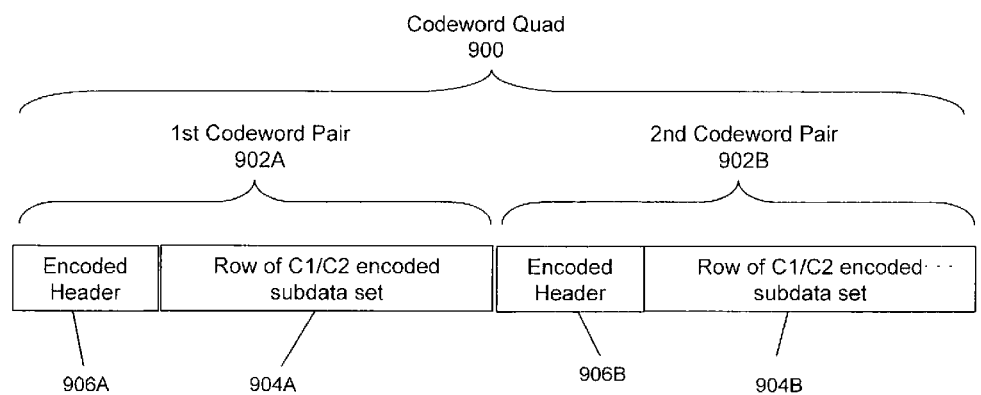
FIG. 9 illustrates the composition of a codeword quad following the encoding of data in accordance with the present invention.

After the C1/C2 encoded subdata sets are generated codeword quads are assembled by a multiplexer 612 in a manner similar to the LTO-3 standard. As illustrated in FIG. 9, consecutive rows of C1/C2 encoded subdata sets 902A, 902B, such as the first and second rows, are interleaved with encoded headers 906A, 906B to form the first and second codeword pairs 902A, 902B, respectively. The two codeword pairs 902A, 902B comprise a codeword quad 900.

Features of the proposed RC architecture for concatenated codes include (i) the user data reorganization into $N_2$ rows: (ii) the formatting block based on the predetermined C2-parity pattern; and (iii) the column-dependent C2-encoding. As a result, the benefits from the features of the reverse concatenation scheme discussed in the Background may be obtained in the present invention; namely, lack of error propagation in the demodulator, improved rate of the modulation code and enabling novel soft decoding techniques based on parity post-processor or turbo coding schemes.

The RC architecture of the present invention adds 16+12=28 bits for modulation to each row. Each row contains 403×8=3224 data bits. Thus, the rate of the RC modulation scheme is:

$R_{RC}$=3224/3252=0.9914

A typical forward concatenation architecture is based on a 16/17 code. Thus:

$R_{FC}$=16/17=0.9412

Consequently, the RC architecture of the present invention has 5.34% higher rate than the standard LTO-3 format while maintaining the same I=11 constraint and weakening the G-constraint from 13 to 22. Furthermore, the RC architecture of the present invention may be extended to 10-bit ECC and longer C1 codes at the cost of weakening the modulation constraints to (G, I)=(24, 12).

By choosing longer C2-codes of essentially the same rate as the LTO-3 code, the performance of the C2-code may be improved. The present invention provides a second embodiment of the reverse concatenation (RC) scheme, which is based on the Reed-Solomon (RS) code with parameters [$N_2$=96, $K_2$=80, $d_2$=17] over the Galois field GF(256), where $N_2$ denotes the length, $K_2$ the dimension, and $d_2$ the minimum Hamming distance of the C2-code. Since the RS-code has length 96, the corresponding RC scheme employs an unencoded user data array with $N_2$=96 rows. An example of such an unencoded user data array of size $N_2 \times U$=96×398, with U=398 unencoded user bytes per row, is illustrated in TABLE VI.

TABLE VI

Example of an unencoded user data array with $N_2$ = 96 rows

| | 0 | 1 | 2 | ... | 397 |
|---|---|---|---|---|---|
| 0 | 0 | 1 | 2 | ... | 397 |
| 1 | 398 | 399 | 400 | ... | 795 |
| → | → | → | → | | → |
| 78 | | | | | |
| 79 | 31442 | 31443 | 31444 | ... | 31839 |
| 79 | | | | | |
| → | → | → | → | | → |
| 95 | 37810 | 37811 | 37812 | ... | 38207 |

Each row of the unencoded user data array is passed through the first modulation encoder 602 and, thus, satisfies a modulation constraint at the input of the formatting block 606. In this second embodiment, the first modulation encoder 602 is similar to that used in the previously described embodiment (having a length 64 C2-code) but is derived from a rate-199/200 interleaved Fibonacci code with a global G=14 and interleaved I=7 constraint. The 8×398=3184 data bits in each row are grouped into 16 bit-sequences all of length 199. Then, all 16 sequences are modulation encoded resulting in 16 bit-sequences all of length 200, which add up to M=400 bytes per row. Thus, the first modulation code transforms the unencoded user data array of TABLE VI into the modulated user data array of TABLE VII of size $N_2 \times M$=96×400.

TABLE VII

Example of modulated user data array with $N_2$ = 96 rows

| | 0 | 1 | 2 | ... | 399 |
|---|---|---|---|---|---|
| 0 | 0 | 1 | 2 | ... | 399 |
| 1 | 400 | 401 | 402 | ... | 799 |
| → | → | → | → | | → |
| 78 | | | | | |
| 79 | 31600 | 31601 | 31602 | ... | 31999 |
| 79 | | | | | |
| → | → | → | → | | → |
| 95 | 38000 | 38001 | 38002 | ... | 38399 |

The formatting block 606 transforms the modulated user data array into an array which has $N_2-K_2$=16 "empty" components in each column. To meet the Diophantine equation $(M+L) \times (N_2-K_2) = N_2 \times L$ with M=400, the number of C2-parity symbols per row must be L=80 resulting in $K_1$=L+M=480 for the dimension of the C1 code on a C2-symbols basis, i.e., in bytes. Note that for the specific selection of parameters of the C2-code, the Diophantine equation simplifies to M=5L. As there are 96 rows in each parity pattern array, there is a total of 96×80=7680 C2-parity bytes per parity pattern array. The insertion locations for these 7680 C2-parity bytes are specified by the following 16 linear equations (modulo 96), which relate the column indices x to the row indices y, namely, y=x+$c_i$(mod 96)

where $c_i$=6i for i=0, 1, 2, ..., 15 and 0≦x<480=$K_1$.

At the input of the C2-encoder 604, every column contains $K_2$=80 modulated data bytes and $N_2-K_2$=16 empty parity locations. In each column, the C2-encoder 604 determines the $N_2-K_2$=16 parity bytes from the $K_2$=80 modulated data bytes and inserts them at the empty parity locations. The output of the C2-encoder 604 is a C2-encoded array of size $N_2 \times K_1$=96×480 which is shown in TABLE VIII, where the locations of the C2-parity bytes are denoted by 'x'.

TABLE VIII

Example of C2-encoded user data array with $N_2 = 96$ rows

|    | 0 | 1 | 2 | 3 | 4 | 5 | 6 | 7 | ... | 479 |
|----|---|---|---|---|---|---|---|---|-----|-----|
| 0  | x |   |   |   |   |   | x |   |     |     |
| 1  |   | x |   |   |   |   |   | x | ... |     |
| 2  |   |   | x |   |   |   |   |   |     |     |
| 3  |   |   |   | x |   |   |   |   |     |     |
| 4  |   |   |   |   | x |   |   |   |     |     |
| 5  |   |   |   |   |   | x |   |   |     | x   |
| 6  | x |   |   |   |   |   | x |   |     |     |
| 7  |   | x |   |   |   |   |   | x |     |     |
| 8  |   |   | x |   |   |   |   |   |     |     |
| 9  |   |   |   | x |   |   |   |   |     |     |
| 10 |   |   |   |   | x |   |   |   |     |     |
| 11 |   |   |   |   |   | x |   |   |     | x   |
| 12 | x |   |   |   |   |   | x |   |     |     |
| 13 |   | x |   |   |   |   |   | x |     |     |
| →  |   |   |   |   |   |   |   |   |     | →   |
| 95 |   |   |   |   |   | x |   |   | ... | x   |

The C1-code is selected as in the previously described embodiment; it has dimension $K_1=480$ and length $N_1=492$ and is obtained by even/odd interleaving of a Reed-Solomon code of dimension 240 and length 246 over GF(256). The 12 parity bytes in each row are passed through a simple systematic second modulation encoder 610, which adds a single bit at the beginning of each parity byte. The modulation bit is obtained by inverting the second bit in each parity byte and by prepending it to the parity byte, which results in a G=22 and an I=11 constraint throughout all the rows.

In terms of implementation, the second embodiment, which is based on a C2-code of length 96 and dimension 80, has advantages over the previously described first embodiment, which is based on a C2-code of length 64 and dimension 54:

(i) The first modulation encoder 602 of the second embodiment is based on a rate-199/200 Fibonacci code, whose length evenly divides the row-length of the modulated user data array and, thus, for each row one can apply 16 times the identical Fibonacci encoder in the second embodiment.

(ii) The column-dependent C2-encoding is simpler for the second embodiment because the parity pattern repeats every sixth column and, thus, at most six different C2-encoders 604 are required whereas for the first embodiment the proposed parity pattern repeats only every 32 columns.

Figure 10:
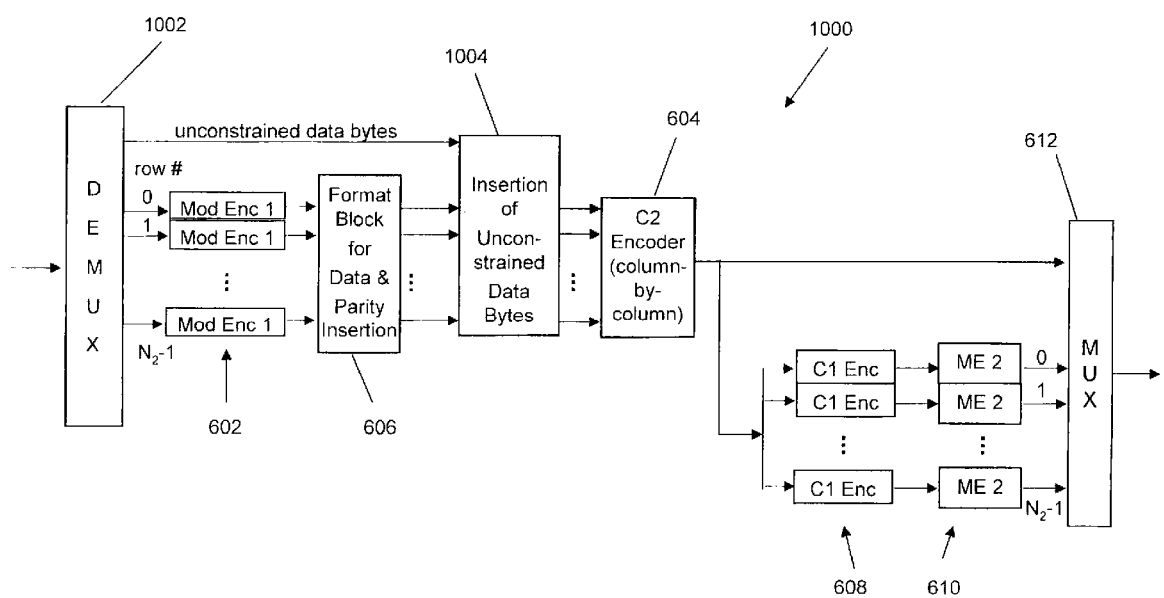
FIG. 10 is a block diagram of an alternative embodiment in which both unconstrained data bytes and parity bytes are inserted into empty locations provided by the formatter.

The present invention further provides a third embodiment of an RC architecture which is based on partial interleaving of a predetermined number of unconstrained data bytes and illustrates the versatility of the empty locations generated by the formatting block 606. In the first two embodiments, described above, the C2-encoder inserts parity bytes into the empty locations. However, the empty locations may also be used in a different way: some may be filled with C2-parity bytes and some may be filled with unconstrained data bytes. FIG. 10 illustrates a block diagram of a RC architecture 1000 for product codes in which unconstrained data bytes are inserted into some of the empty locations provided by the formatter 606 and parity bytes are inserted into the remaining empty locations. The insertion of the unconstrained data bytes occurs prior to the C2-encoder because the C2-encoder needs these bytes for computing the parity bytes. The unconstrained data bytes are generated by a de-multiplexer 1002. The de-multiplexer 1002 splits the user data into one part that is processed by the first set of modulation encoders 602 and a second part that bypasses the first set of modulation encoders 602 and is processed by the insertion block 1004 prior to the C2-encoder 604.

The RC architecture of the third embodiment uses as C2-code an RS code with parameters $[N_2=96, K_2=81, d_2=16]$ over the Galois field GF(256), where $N_2$ denotes the length, $K_2$ the dimension, and $d_2$ the minimum Hamming distance of the C2-code. For each subdata set, there are $N_2 \times (U+D)=96 \times 399=38,304$ bytes of user data, which are split into $N_2 \times U=96 \times 394=37,824$ bytes that are encoded by the first modulation encoder 602 and $N_2 \times D=96 \times 5=480$ bytes that are processed by the insertion block 1004 prior to the C2-encoder 604. Thus, the unencoded user data array has size $N_2 \times U=96 \times 394$. Each row of this array is encoded by a rate-197/200 interleaved Fibonacci code with global G=10 and interleaved I=5 constraint. Applying the rate-197/200 modulation encoder 16 times per row, each row of the unencoded subdata set with its $8 \times 394=3152$ bits is mapped into a row of the modulated user data array of size $N_2 \times M=96 \times 400$.

The formatting block 606 transforms the modulated user data array into an array with $N_2-K_2+T$ "empty" locations in each column, where T is the number of unconstrained data bytes per column that are inserted by the insertion block 1004. For T=1, there are 16 empty locations in each column, although it will be appreciated that T may equal some other number. One of these 16 empty locations will be filled by an unconstrained data byte and the remaining $N_2-K_2$ empty locations will be filled with C2-parity bytes. To meet the Diophantine equation $(M+L) \times (N_2-K_2+T)=N_2 \times L$ with M=400 and T=1, the number of empty locations per row must be L=80, resulting in $K_1=L+M=480$ for the dimension of the C1-code on a C2-symbols basis, i.e., in bytes. As there are 96 rows in each parity pattern array, there is a total of $96 \times 80=7680$ empty locations per parity pattern array. The 7680 insertion locations are specified by the following 16 linear equations (modulo 96), which relate the column indices x to the row indices y, namely.

$$y \equiv x+c_i \pmod{96}$$

where $c_i=6i$ for $i=0, 1, 2, \ldots, 15$ and $0 \leq x < 480 = K_1$.

The unconstrained $N_2 \times D=96 \times 5=480=(M+L) \times T$ data bytes are inserted into all the 480 empty locations within the first six rows of the array, i.e., at locations specified by the above equations subject to the additional condition $0 \leq y < 6$ on the row index. In each column, exactly T=1 unconstrained data byte is inserted and there remain $N_2-K_2=15$ empty locations to be filled with C2-parity bytes.

At the input of the C2-encoder 604, every column contains $K_2=81$ modulated or unconstrained data bytes and $N_2-K_2=15$ empty parity locations. In each column, the C2-encoder 604 determines the $N_2-K_2=15$ parity bytes from these $K_2=81$ bytes and inserts them at the empty parity locations. The output of the C2-encoder 604 is a C2-encoded array of size $N_2 \times K_1=96 \times 480$, shown in TABLE IX in which the locations of the C2-parity bytes are denoted by 'p' and the previously inserted unconstrained data bytes are denoted by 'd'. Note that at most only six different column-dependent C2-encoders 604 are required because the parity pattern repeats every sixth column. The insertion of parity and unconstrained data bytes weakens the I=5 and G=10 modulation constraints of the first modulation code along each row to I=9 and G=18 after C2-encoding.

TABLE IX

Example of C2-encoded user data array with $N_2 = 96$ rows

|    | 0 | 1 | 2 | 3 | 4 | 5 | 6 | 7 | ... | 479 |
|----|---|---|---|---|---|---|---|---|-----|-----|
| 0  | d |   |   |   |   |   | d |   |     |     |
| 1  |   | d |   |   |   |   |   | d | ... |     |
| 2  |   |   | d |   |   |   |   |   |     |     |
| 3  |   |   |   | d |   |   |   |   |     |     |
| 4  |   |   |   |   | d |   |   |   |     |     |
| 5  |   |   |   |   |   | d |   |   |     | d   |
| 6  | p |   |   |   |   |   | p |   |     |     |
| 7  |   | p |   |   |   |   |   | p |     |     |
| 8  |   |   | p |   |   |   |   |   |     |     |
| 9  |   |   |   | p |   |   |   |   |     |     |
| 10 |   |   |   |   | p |   |   |   |     |     |
| 11 |   |   |   |   |   | p |   |   |     | p   |
| 12 | p |   |   |   |   |   | p |   |     |     |
| 13 |   | p |   |   |   |   |   | p |     |     |
| →  |   |   |   |   |   |   |   |   |     | →   |
| 95 |   |   |   |   |   | p |   |   | ... | p   |

The C1-code is selected in the same fashion as it is selected for the previously described first and second embodiments. The C-1 code has dimension $K_1=480$ and length $N_1=492$ and is obtained by even/odd interleaving of a Reed-Solomon code of dimension 240 and length 246 over GF(256). The 12 parity bytes in each row are passed through a simple systematic second modulation encoder ME2 610, which adds a single bit at the beginning of each parity byte. The modulation bit may be obtained by inverting the second bit in each parity byte and by prepending it to the parity byte, which results in an I=9 and G=18 constraint throughout all the rows.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies regardless of the particular type of signal bearing media actually used to carry out the distribution. Examples of computer readable media include recordable-type media such as a floppy disk, a hard disk drive, a RAM, and CD-ROMs and transmission-type media such as digital and analog communication links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to systems and methods, the need in the art may also be met with computer program products containing instructions for encoding data for recording onto media.

What is claimed is:

1. A reverse concatenation encoding system for a recording write path, comprising:
  a user data array generator operable to process input user data and generate a first data array;
  a first modulation encoder operable to impose a first modulation constraint on a respective row of the first data array and generate a second data array comprising modulation-constrained data;
  a formatter operable to process the second data array by inserting predetermined empty locations in each column of the second data array interleaved with the modulation-constrained data and generate a third data array;
  a C2-encoder operable to compute a C2-parity byte for each of a plurality of the empty locations in each column of the third data array and generate a fourth data array;
  a C1-encoder operable to compute a C1-parity symbol for each row of the fourth data array and generate a fifth data array;
  a second modulation encoder operable to impose a second modulation constraint on each C1-parity symbol of the fifth data array and generate a sixth data array; and
  means for recording the rows of the sixth data array onto tracks of a recording medium.

2. The system of claim 1, wherein the C2-encoder is operable to compute a C2-parity byte for each empty location in each column of the third data array.

3. The system of claim 1, further comprising:
  a de-multiplexer operable to generate a plurality of unconstrained data bytes; and
  an insertion block operable to insert the unconstrained data bytes into at least one of the empty locations in each column of the third data array and insert the computed C2-parity bytes into the remaining empty locations in each column of the third data array.

4. The system of claim 3, wherein:
  the formatter determines the empty locations such that the third data array satisfies a Diophantine equation $(M+L)\times(N_2-K_2+1)=N_2\times L$ which is satisfied by $M+L=K_1=480$, $L=80$ and $N_2-K_2=15$;
  the empty locations are separated by a predetermined minimum amount of at least two; and
  the empty locations are identified by $y \equiv x+c_i \pmod{96}$, where x and y are column and row indices of the third data array, respectively, $c_i=6i$ for $i=0, 1, 2, \ldots 15$ and $0 \leq x < 480 = K_1$.

5. The system of claim 1, wherein the formatter is further operable to process the second data array so that the empty locations in the third data array are separated by a predetermined number of bytes and so that respective dimensions of the second data array and third data array satisfy a Diophantine equation.

6. The system of claim 5, wherein the Diophantine equation is $(M+L)\times(N_2-K_2)=N_2\times L$ wherein:
  $M+L=K_1$, where M is the number of columns in the second data array, L is the extent by which the number of rows in the second data array is extended during processing of the second data array by the formatter and $K_1$ is the number of columns in the third data array; and
  $N_2-K_2$ is the number of predetermined number of bytes separating the empty locations in the third data array, where $N_2$ is the number of rows in the second data array and $K_2$ is the dimension of a C2-code of the C2-encoder.

7. The system of claim 6, wherein:
  the Diophantine equation is satisfied by $M+L=K_1=480$, $L=75$, $N_2=64$ and $N_2-K_2=10$;
  the predetermined number of bytes by which the empty locations of the third data array are separated is at least two; and
  the empty locations of the third data array are identified by $y \equiv x+c_i \pmod{64}$, where x and y are column and row indices of the third data array, respectively, $c_i \in \{0, 6, 13, 19, 26, 32, 38, 45, 51, 58\}$ and $0 \leq x<480=K_1$.

8. The system of claim 6, wherein:
  the Diophantine equation is satisfied by $M+L=K_1=480$, $L=80$ and $N_2-K_2=16$;

the predetermined number of bytes by which the empty locations of the third data array are separated is at least two; and the empty locations of the third data array are identified by $y \equiv x+c_i$ (mod 96), where x and y are column and row indices of the third data array, respectively, $c_i=6i$ for $i=0, 1, 2, \ldots 15$ and $0 \leq x < 480 = K_1$.

9. The system of claim 1, wherein the first modulation encoder is derived from a modulation code which supports partial symbol interleaving such that predetermined global-G and interleaved-I modulation constraints are satisfied after partial symbol interleaving.

10. The system of claim 1, wherein the first modulation encoder is derived from a rate-215/216 interleaved Fibonacci modulation code which satisfies modulation constraints of a global G=14 and an interleaved I=7 constraint prior to partial symbol interleaving.

11. The system of claim 1, wherein each first modulation encoder is derived from a rate-199/200 interleaved Fibonacci modulation code which satisfies modulation constraints of a global G=14 and an interleaved I=7 constraint prior to partial symbol interleaving.

12. The system of claim 1, wherein the first modulation encoder is derived from a rate-197/200 interleaved Fibonacci modulation code which satisfies modulation constraints of a global G=10 and an interleaved I=5 constraint prior to partial symbol interleaving.

13. The system of claim 1, wherein the 02-encoder comprises a rate $K_2/N_2$ Reed-Solomon encoder over the Galois field $GF(2^m)$, wherein $N_2$ is the number of rows in the second data array and $K_2$ is the dimension of a C2-code of the C2-encoder and codeword components are m-bit symbols.

14. The system of claim 13, wherein the C1-encoder comprises an encoder for an even/odd interleaved Reed-Solomon code of dimension $K_1$ and length $N_1$ over $GF(2^8)$, where $K_1$ is the number of columns in the third data array and $N_1$ is the length of a C1-code of the C1-encoder.

15. The system of claim 13, wherein:

the C1-encoder generates $N_1-K_1$ interleaved Reed-Solomon parity symbols, where $K_1$ is the number of columns in the third data array and $N_1$ is the length of the C1 code; and the C1-encoder appends the parity symbols to the end of each row.

16. The system of claim 1, wherein the C1-encoder is derived from a linear code over a Galois field $GF(2^r)$ and which has dimension $mK_1$ over $GF(2)$ and the codeword components are r-bit symbols.

17. The system of claim 1, wherein the C1-encoder is derived from a low-density parity-check code over a Galois field $GF(2^r)$ and which has dimension $mK_1$ over $GF(2)$.

18. The system of claim 1, wherein the second modulation encoder comprises a systematic modulation encoder.

19. The system of claim 18, wherein the second modulation encoder comprises an inverter for inverting the second bit of each C1-parity symbol and prepending the inverted bit to the C1-parity symbol.

20. The system of claim 1, further comprising:

a codeword pair header and codeword quad generator operable to interleave the rows of the sixth data array with codeword headers and generate codeword quads; and a write formatter operable to map the codeword quads to logical tracks of the recording medium.

* * * * *